(12) United States Patent
Yamazaki et al.

(10) Patent No.: US 10,411,037 B2
(45) Date of Patent: Sep. 10, 2019

(54) SEMICONDUCTOR DEVICE AND COMMUNICATION SYSTEM

(71) Applicant: Semiconductor Energy Laboratory Co., Ltd., Atsugi-shi, Kanagawa-ken (JP)

(72) Inventors: Shunpei Yamazaki, Setagaya (JP); Kiyoshi Kato, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 64 days.

(21) Appl. No.: 15/198,098

(22) Filed: Jun. 30, 2016

(65) Prior Publication Data

US 2016/0307009 A1 Oct. 20, 2016

Related U.S. Application Data

(63) Continuation of application No. 11/596,806, filed as application No. PCT/JP2005/011098 on Jun. 10, 2005, now Pat. No. 9,384,439.

(30) Foreign Application Priority Data

Jun. 14, 2004 (JP) ................................ 2004-176289

(51) Int. Cl.
*H01L 27/12* (2006.01)
*G06K 19/077* (2006.01)
(Continued)

(52) U.S. Cl.
CPC ........ *H01L 27/1218* (2013.01); *G02F 1/1368* (2013.01); *G02F 1/13338* (2013.01);
(Continued)

(58) Field of Classification Search
USPC .................................................. 235/439, 492
See application file for complete search history.

(56) References Cited

U.S. PATENT DOCUMENTS 5,854,480 A * 12/1998 Noto ................ G06K 19/07739
235/492
6,127,199 A 10/2000 Inoue et al.
(Continued)

FOREIGN PATENT DOCUMENTS

EP 0858110 A 8/1998
EP 1351308 A 10/2003
(Continued)

OTHER PUBLICATIONS

International Search Report (Application No. PCT/JP2005/011098) dated Sep. 27, 2005.
(Continued)

*Primary Examiner* — Rafferty D Kelly
(74) *Attorney, Agent, or Firm* — Robinson Intellectual Property Law Office; Eric J. Robinson

(57) ABSTRACT

It is an object of the present invention to provide a semiconductor device in which a sophisticated integrated circuit using a polycrystalline semiconductor is formed over a substrate which is weak with heat such as a plastic substrate or a plastic film substrate and a semiconductor device which transmits/receives power or a signal without wires, and a communication system thereof. One feature of the invention is that a semiconductor device, specifically, a processor, in which a sophisticated integrated circuit is fixed to a plastic substrate which is weak with heat by a stripping method such as a stress peel of process method to transmit/receive power or a signal without wires, for example, with an antenna or a light receiving element.

21 Claims, 13 Drawing Sheets

(51) Int. Cl.
  *G02F 1/1333* (2006.01)
  *G02F 1/1368* (2006.01)
  *G06K 7/10* (2006.01)
  *H01L 23/66* (2006.01)
  *H01L 23/00* (2006.01)
  *H01L 29/786* (2006.01)

(52) U.S. Cl.
  CPC ... *G06K 7/10217* (2013.01); *G06K 19/07749* (2013.01); *H01L 23/66* (2013.01); *H01L 24/32* (2013.01); *H01L 27/1222* (2013.01); *H01L 27/1266* (2013.01); *H01L 29/78678* (2013.01); *H01L 29/78696* (2013.01); *H01L 27/12* (2013.01); *H01L 27/1214* (2013.01); *H01L 2223/6677* (2013.01); *H01L 2224/32225* (2013.01); *H01L 2924/13069* (2013.01); *H01L 2924/141* (2013.01); *H01L 2924/1432* (2013.01); *H01L 2924/1579* (2013.01)

(56) References Cited

U.S. PATENT DOCUMENTS

| | | |
|---|---|---|
| 6,236,063 B1 | 5/2001 | Yamazaki et al. |
| 6,372,608 B1 | 4/2002 | Shimoda et al. |
| 6,549,064 B2 | 4/2003 | Bandy et al. |
| 6,645,830 B2 | 11/2003 | Shimoda et al. |
| RE38,466 E | 3/2004 | Inoue et al. |
| 6,814,832 B2 | 11/2004 | Utsunomiya |
| 6,818,530 B2 | 11/2004 | Shimoda et al. |
| 6,875,998 B2 | 4/2005 | Kato et al. |
| 7,061,083 B1* | 6/2006 | Usami .................. H01Q 1/2208 257/679 |
| 7,094,665 B2 | 8/2006 | Shimoda et al. |
| 7,130,234 B2 | 10/2006 | Shionoiri et al. |
| 7,142,117 B2 | 11/2006 | Watanabe |
| 7,147,740 B2 | 12/2006 | Takayama et al. |
| 7,285,476 B2 | 10/2007 | Shimoda et al. |
| 7,332,815 B2 | 2/2008 | Shionoiri et al. |
| 7,344,925 B2 | 3/2008 | Kato et al. |
| 7,348,875 B2 | 3/2008 | Hughes et al. |
| 7,405,665 B2 | 7/2008 | Yamazaki |
| 7,430,146 B2 | 9/2008 | Shionoiri et al. |
| RE40,601 E | 12/2008 | Inoue et al. |
| 7,468,308 B2 | 12/2008 | Shimoda |
| 7,541,228 B2 | 6/2009 | Kato et al. |
| 7,710,240 B2 | 5/2010 | Kang et al. |
| 2002/0043662 A1* | 4/2002 | Yamazaki .......... H01L 21/2022 257/72 |
| 2003/0032210 A1* | 2/2003 | Takayama .......... H01L 29/7869 438/30 |
| 2003/0142550 A1 | 7/2003 | Kawahara et al. |
| 2003/0231566 A1* | 12/2003 | Smith ................. G06K 19/0713 369/47.25 |
| 2005/0052283 A1 | 3/2005 | Collins et al. |
| 2005/0112805 A1 | 5/2005 | Goto et al. |
| 2005/0186904 A1 | 8/2005 | Kowalski et al. |
| 2006/0166411 A1* | 7/2006 | Morisue ........... H01L 27/14621 438/149 |
| 2007/0120681 A1* | 5/2007 | Yamazaki ........ G06K 19/07749 340/572.8 |
| 2007/0243352 A1 | 10/2007 | Takayama et al. |
| 2009/0321004 A1 | 12/2009 | Takayama et al. |

FOREIGN PATENT DOCUMENTS

| | | |
|---|---|---|
| EP | 1363319 A | 11/2003 |
| EP | 1655633 A | 5/2006 |
| EP | 1744365 A | 1/2007 |
| EP | 1758169 A | 2/2007 |
| JP | 07-057067 A | 3/1995 |
| JP | 10-125931 A | 5/1998 |
| JP | 10-307898 A | 11/1998 |
| JP | 11-020360 A | 1/1999 |
| JP | 2003-142666 A | 5/2003 |
| JP | 2003-195973 A | 7/2003 |
| JP | 2003-203898 A | 7/2003 |
| JP | 2004-006725 A | 1/2004 |
| JP | 2004-047975 A | 2/2004 |
| JP | 2004-103719 A | 4/2004 |
| JP | 2005-311295 A | 11/2005 |
| JP | 2006-004015 A | 1/2006 |

OTHER PUBLICATIONS

Written Opinion (Application No. PCT/JP2005/011098) dated Sep. 27, 2005.
Lee.B et al., "9.4 A CPU on a Glass Substrate Using Cg-Silicon TFTS", ISSCC 2003 (Digest of Technical Papers. IEEE International Solid-State Circuits Conference), Feb. 11, 2003, pp. 164-165.
Imaya.A, "Cg Silicon Technology and Its Application", AM-LCD '03 Digest of Technical Papers, 2003, pp. 1-4.

* cited by examiner

SEMICONDUCTOR DEVICE AND COMMUNICATION SYSTEM

TECHNICAL FIELD

The present invention relates to a semiconductor device in which a plastic material is used for a substrate and an integrated circuit is formed using a thin film transistor thereover, specifically, a processor. Moreover, the invention relates to a communication system having the semiconductor device.

BACKGROUND ART

A liquid crystal display panel, in which a pixel portion and a driver circuit are integrated over the same glass substrate utilizing a thin film transistor (hereinafter, also referred to as a "TFT") using a crystalline semiconductor film having a thickness of several ten nanometers, is developed. Further, technique for manufacturing a CPU (Central Processing Unit) having a function as a center of a computer using high-performance polycrystalline silicon which is superior in a crystalline property, is reported (For example, refer to Non-Patent Document 1: Imaya, A., "CG Silicon technology and its application", AM-LCD 2003 Digest, p.1, 2003 and Non-Patent Document 2: Lee, B. Y., et al., "A CPU on a glass substrate using CG-Silicon TFTs", ISSCC Digest, p. 164, 2003). According to such technical progress, feasibility of a system panel integrating a display function and a function of a computer realized by a CPU over a glass substrate has been increased.

A liquid crystal display panel is applied as a display means attached to various electronic devices and a study of using plastic or a plastic film as a substrate for a display substrate mainly used as a portable electronic device has been advanced. A plastic material has a feature capable of being thinned since the plastic material has low specific gravity, lightweight, and has high impact resistance compared with glass.

However, a plastic material is generally poor in heat resistance; therefore, a highest temperature of processing is required to be lowered and a high-quality crystalline semiconductor film has not been able to be formed even today. Hence, a system panel as described above had not been able to be realized.

DISCLOSURE OF INVENTION

In view of the foregoing backgrounds, it is an object of the present invention to provide a semiconductor device in which a sophisticated integrated circuit using a polycrystalline semiconductor is formed over a substrate which is weak with heat such as a plastic substrate or a plastic film substrate and a semiconductor device which transmits/receives power or a signal without wires, and a communication system thereof.

In view of the foregoing problems, one feature of the invention is that a semiconductor device, specifically, a processor, in which a sophisticated integrated circuit is fixed to a plastic substrate which is weak with heat by a stripping method such as a stress peel of process (hereinafter, also referred to as a SPOP) method to transmit/receive power or a signal without wires, for example, with an antenna or a light receiving element.

One specific mode of the invention is a semiconductor device which comprises an integrated circuit and an antenna, wherein the integrated circuit has a transistor over a plastic substrate, and a semiconductor film of the transistor has a thickness of from 10 nm to 200 nm.

Another mode of the invention is a semiconductor device which comprises an integrated circuit and a light receiving element, wherein the integrated circuit has a transistor fixed to a plastic substrate, and a semiconductor film of the transistor has a thickness of from 10 nm to 200 nm.

For example, a thin film transistor can be used for a transistor in which at least a channel formation region is formed from an island-shaped semiconductor film which has a film thickness of from 10 nm to 200 nm.

One kind selected from polycarbonate, polyarylate, and polyethersulfone can be used for the plastic substrate.

A semiconductor device mounted with such an antenna can provide a communication system which receives power or a signal from a reader/writer device without wires, specifically, with an antenna. Further, a semiconductor device mounted with a light receiving element can also provide a communication system which receives power or a signal from a reader/writer device without wires, specifically, with an antenna or a light receiving element.

According to the invention, poor connection or the like of a connector can be eliminated by transmitting/receiving power or a signal without wires. Further, a problem with handling or the like due to a wiring connecting each of the devices can be eliminated. Thus, an added value of a processor can be enhanced by transmitting/receiving power or a signal without wires. A buttery or the like is not required to be mounted since power can be received without wires, and thus, a further lightweight electronic device can be achieved.

According to the invention, a semiconductor device, specifically, a processor, which is superior in impact resistance or flexibility can be obtained by forming a sophisticated integrated circuit such as an arithmetic means over a plastic substrate.

BEST MODE FOR CARRYING OUT THE INVENTION

Hereinafter, embodiment modes according to the present invention are described in detail with reference to the drawings. However, it is easily understood by those who are skilled in the art that embodiments and details herein disclosed can be modified in various ways without departing from the purpose and the scope of the present invention. Therefore, it should be noted that the description of embodiment modes to be given below should not be interpreted as limiting the present invention. Further, through the whole drawings of the embodiment modes, portions having like components or similar functions are denoted by like numerals and will not be further explained.

Embodiment Mode 1

In this embodiment mode, a configuration of a processor is described.

Figure 1A:
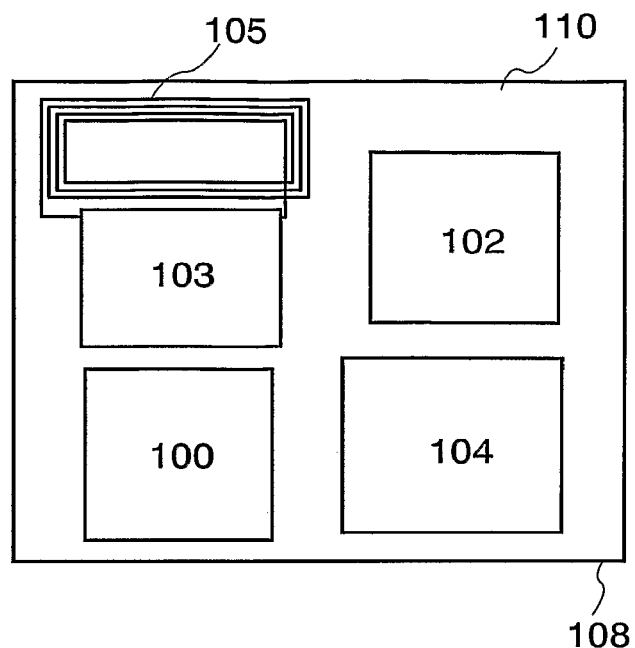
FIGS. 1A and 1B are views showing a processor of the present invention.

FIG. 1A shows a processor 108 having an arithmetic processing means (that serves as a so-called CPU) 100, a storage means 102, a power supply circuit 103, an interface (I/F) 104, and an antenna 105. A memory can be used for the storage means 102, for example, ROM, RAM, SRAM, or a nonvolatile memory. The antenna 105 is connected to the power supply circuit 103, then power received from the antenna is inputted to the power supply circuit 103, and then the power can be supplied to the arithmetic processing means 100, the storage means 102, and the interface (I/F) 104.

According to the processor 108 shown in FIG. 1A, poor connection or the like of a connector can be eliminated by transmitting/receiving power or a signal without wires, specifically, with an antenna. Further, a problem with handling or the like due to the state of the processor provided with a number of wirings can be eliminated. Thus, an added value of a processor can be enhanced by transmitting/receiving power or a signal without wires.

The arithmetic processing means 100, the storage means 102, the power supply circuit 103, and the interface (I/F) 104 (these correspond to a sophisticated integrated circuit) are formed so as to have an element formation region having a transistor in which at least a channel formation region is formed by an island-shaped semiconductor film which is formed over an insulating surface 110 to have a film thickness of from 10 nm to 200 nm. Specifically, a thin film transistor (TFT) can be used as a transistor.

Figure 1B:
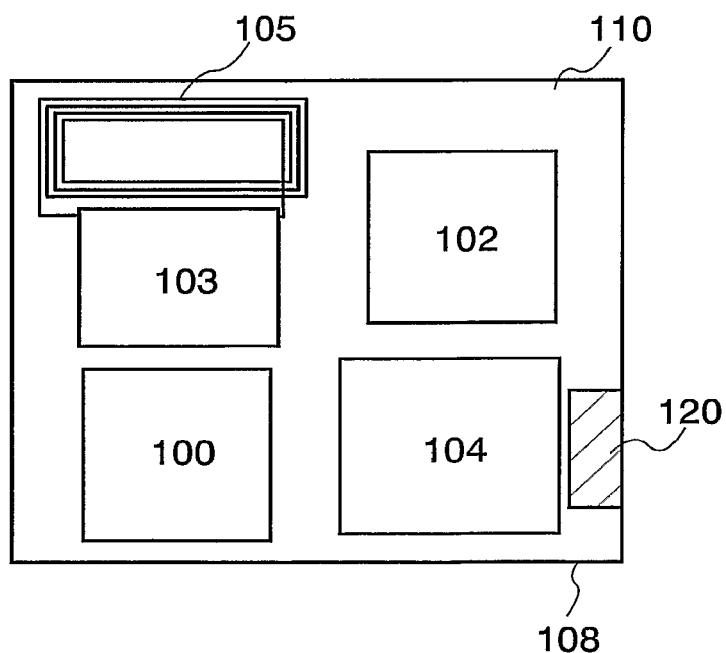

FIG. 1B illustrates a configuration of a processor in the case of receiving a signal using light. A configuration shown in FIG. 1B is required to receive light and therefore has a light receiving element 120 in addition to the configuration of FIG. 1A. A photodiode formed over the insulating surface 110 can be used for the light receiving element 120. The photodiode can be manufactured through the same step as that of the thin film transistor. The processor 108 shown in FIG. 1B can receive a signal using the light receiving element 120 and can receive power using the antenna 105. Consequently, a signal and power can be separately received; therefore, the load of each circuit and the load of signal processing can be reduced. Thus, the processor 108 enables to receive a number of signals.

According to the processor shown in FIG. 1B, poor connection or the like of a connector can be eliminated in the similar way as in FIG. 1A. Further, a problem with handling or the like due to the state of the processor provided with a number of wirings can be eliminated. Thus, an added value of a processor can be enhanced by transmitting/receiving power or a signal without wires.

In the processor shown in FIGS. 1A and 1B, a sophisticated integrated circuit is formed using a polycrystalline semiconductor film by a SPOP method without being limited by a process temperature, then, the sophisticated integrated circuit is directly stripped to be fixed over a plastic substrate or a plastic film substrate; therefore, an initial performance of an integrated circuit is not detracted. Consequently, lightweight is attained and a processor which is superior in impact resistance can be obtained. Such a processor provided with a number of sophisticated integrated circuits is referred to as a systematized processor.

The sophisticated integrated circuit of the invention is not limited to a thin film transistor manufactured by a SPOP method. A thin film transistor may be manufactured by forming a polycrystalline semiconductor film over a plastic substrate or a plastic film substrate with continuous oscillation laser (CW laser) irradiation or pulsed oscillation laser (pulse laser) irradiation. For example, by means of a stripping method other than a SPOP method, a stripping layer formed over a glass substrate may be eliminated by laser irradiation, and an element formation region may be fixed over a plastic substrate or a plastic film substrate. Further, a glass substrate may be eliminated by etching or the like and an element formation region may be fixed over a plastic substrate or a plastic film substrate.

Next, an example of a configuration of the arithmetic processing means 100 is described. In this embodiment mode, the arithmetic processing means 100 having a RISC configuration is taken as an example. A RISC configuration has a simple configuration since the number of clocks per one instruction is determined compared with a CISC configuration. Further, a RISC configuration has a feature of carrying out pipeline processing.

Figure 7:
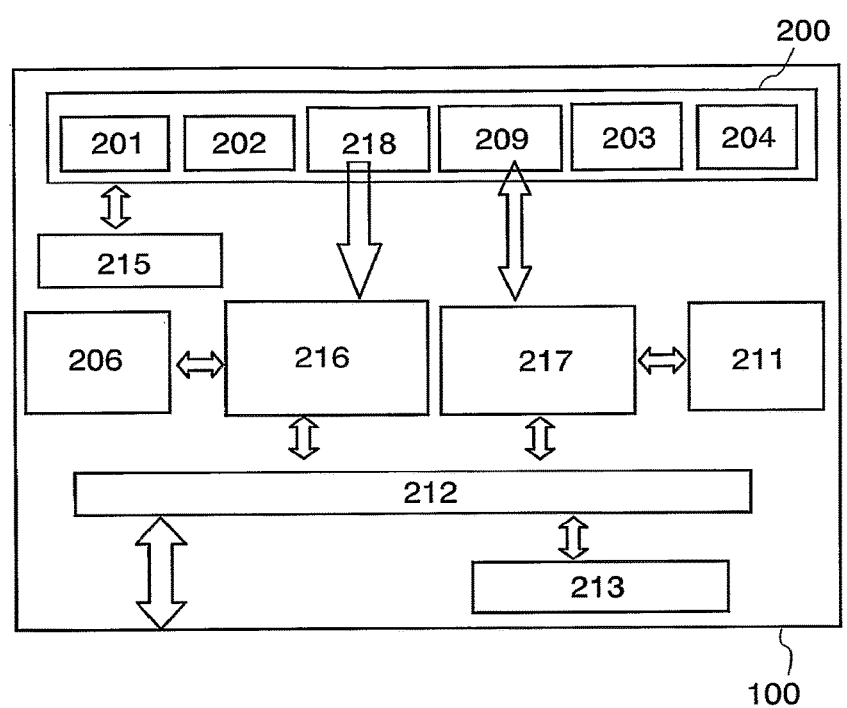
FIG. 7 is a diagram showing an arithmetic processing means which a processor of the invention has.

FIG. 7 shows an arithmetic processing means 100 having integer arithmetic units: an ALU1 (201) and an ALU2 (202), a load store unit (218), a branch prediction unit (209), and floating point arithmetic units: a FPU1 (203) and FPU2 (204) as an execution unit (200), and further having a general register (215), a primary data cache (206), a data cache controller (216), an instruction cache controller (217), a primary instruction cache (211), a bus interface (212), and a second cache (213).

In such the arithmetic processing means 100, the ALU1 (201) and the ALU2 (202) perform integer arithmetic, and the FPU1 (203) and the FPU2 (204) perform floating point arithmetic. Each of an arithmetic result is stored in the general register (215). The instruction cache controller (217) controls an instruction fetch and a decode from an external memory, and the primary instruction cache (211). Branch prediction is performed according to the branch prediction unit (209). The data cache controller (216) controls the flow of data among an external bus, the primary data cache (206), and the load store unit (218). The bus interface (212) is an interface portion between the external bus and an inside of a CPU. In this embodiment mode, a configuration provided with the second cache (213) is used; however, the second cache (213) is not always required.

The arithmetic processing means 100 shown in FIG. 7 is a comparatively simple configuration as a CPU; therefore, an area in which the arithmetic processing means is occupied can be reduced and low power consumption can be attained. As a result, the arithmetic processing means is preferably used for a small-sized semiconductor device such as an ID chip.

Figure 8:
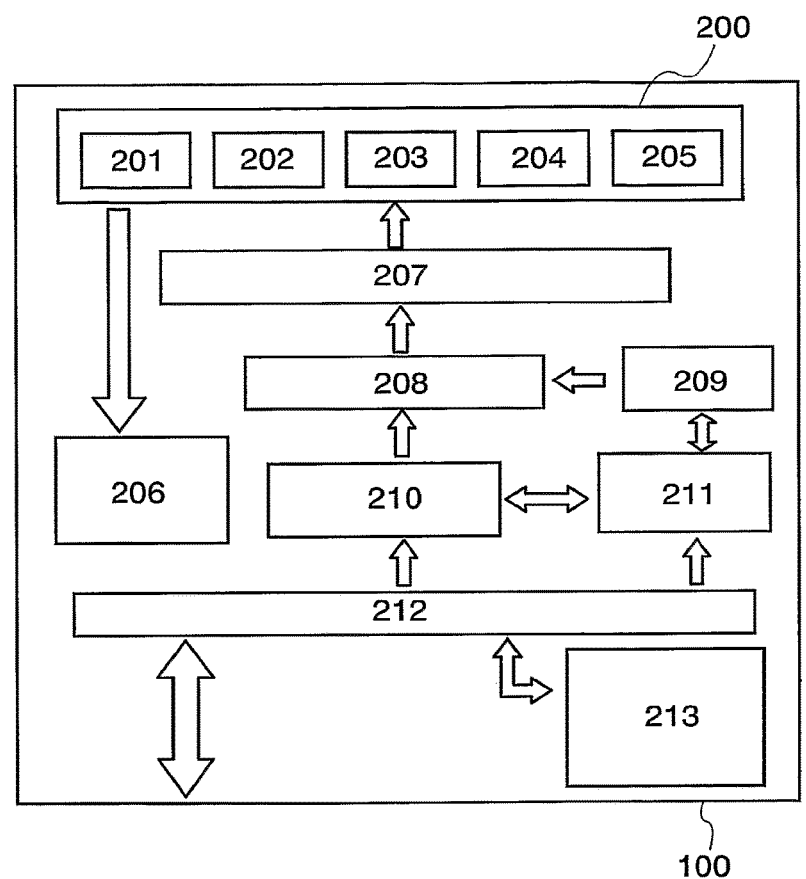
FIG. 8 is a diagram showing an arithmetic processing means which a processor of the invention has.

FIG. 8 shows a configuration of an arithmetic processing means 100 which has a different configuration from that of FIG. 7. FIG. 8 shows the arithmetic processing means 100 having integer arithmetic units: an ALU1 (201) and an ALU2 (202), floating point arithmetic units: a FPU1 (203) and a FPU2 (204), and a memory interface (memory IF) (205) as an execution unit (200), and further having a primary data cache (206), a reservation station (207), an instruction decoder (208), a branch prediction unit (209), an instruction fetch unit (210), a primary instruction cache (211), a bus interface (212), and a second cache (213). The arithmetic processing means 100 shown in FIG. 8 has a feature of being provided with the reservation station 207.

In such the arithmetic processing means 100, the ALU1 (201) and the ALU2 (202) perform integer arithmetic, and the FPU1 (203) and the FPU2 (204) perform floating point arithmetic. Each of the arithmetic result is stored in a general register (not shown). The instruction fetch unit (210) performs an instruction fetch from the primary instruction cache (211), and the instruction decoder (208) decodes an instruction based on information from the branch prediction unit (209). The reservation station (207) is a block for performing scheduling to execute the decoded instruction in the execution unit. Then, the result of the execution unit is stored in the primary data cache (206). The bus interface (212) is an interface portion between an external bus and an inside of a CPU. In this embodiment mode, a configuration provided with the second cache (213) is used; however, the second cache (213) is not always required.

By providing such the reservation station (207), scheduling an instruction can be performed, the efficiency of pipeline processing can be enhanced, and operation speed can be improved.

Figure 9:
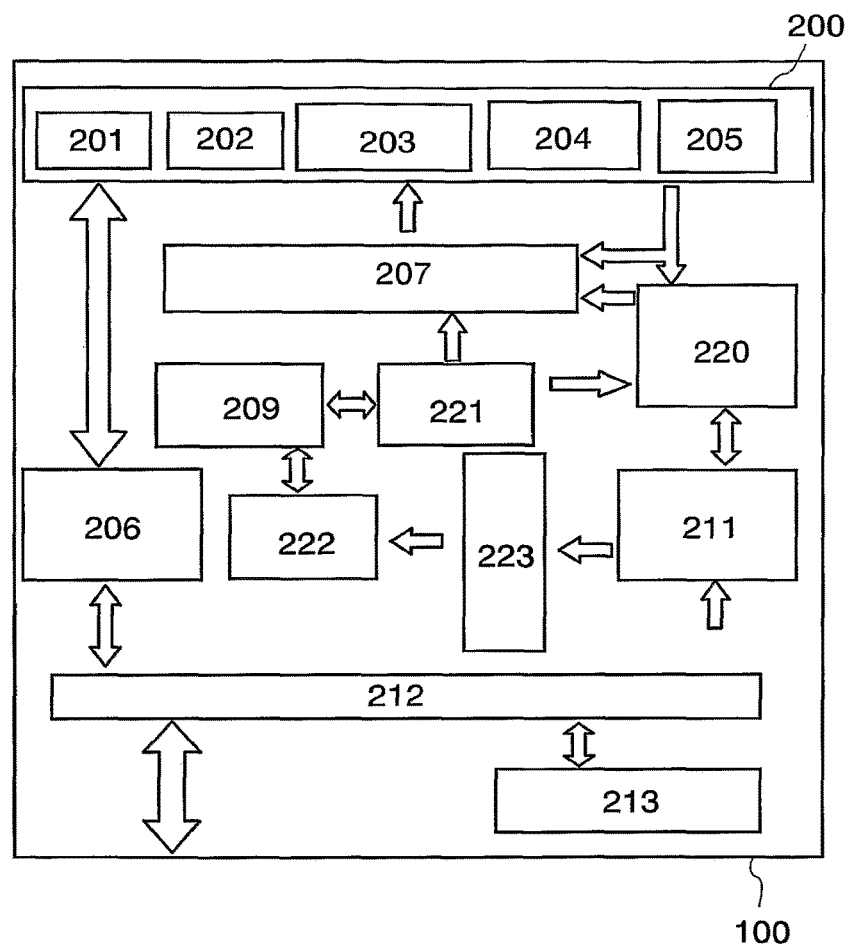
FIG. 9 is a diagram showing an arithmetic processing means which a processor of the invention has.

FIG. 9 shows a configuration of an arithmetic processing means 100 which has a different configuration from that of FIGS. 7 and 8. FIG. 9 shows the arithmetic processing means 100 having integer arithmetic units: an ALU1 (201) and an ALU2 (202), floating point arithmetic units: a FPU1 (203) and FPU2 (204), and a memory interface (memory IF) (205) as an execution unit (200), and further having a primary data cache (206), a reservation station (207), a primary instruction cache (211), a bus interface (212), a second cache (213), a renaming unit (220), an instruction issue unit (221), a zero-order cache (222), and a predecoder (223). A general register 215 is included in the similar way as in FIG. 7; therefore, the description is omitted. The arithmetic processing means 100 shown in FIG. 9 has a feature of being provided with the renaming unit 220 in addition to the reservation station 207 to enhance the efficiency of pipeline processing and dividing the decode of the instruction into two steps.

In such the arithmetic processing means 100, the ALU1 (201) and the ALU2 (202) perform integer arithmetic, and the FPU1 (203) and the FPU2 (204) perform floating point arithmetic. Each of the arithmetic result is stored in a general register (not shown). The predecoder (223) performs an instruction fetch from the primary instruction cache, performs predecode, and stores in the zero-order cache (222). The instruction issue unit (221) fetches a code predecoded from the zero-order cache, and decodes the code based on information of the branch prediction unit 209. The reservation station (207) performs scheduling to execute the decoded instruction in the execution unit. Based on information of the renaming unit (220), an advanced optimization can be performed. Then, the result of the execution unit is stored in the primary data cache (206). The bus interface (212) is an interface portion between an external bus and an inside of a CPU. In this embodiment mode, a configuration provided with the second cache (213) is used; however, the second cache (213) is not always required.

In this embodiment mode, an advanced optimization is performed by providing the renaming unit (220) as well as the reservation station (207), and high operation speed is realized by dividing the decode into two steps.

Figure 13:
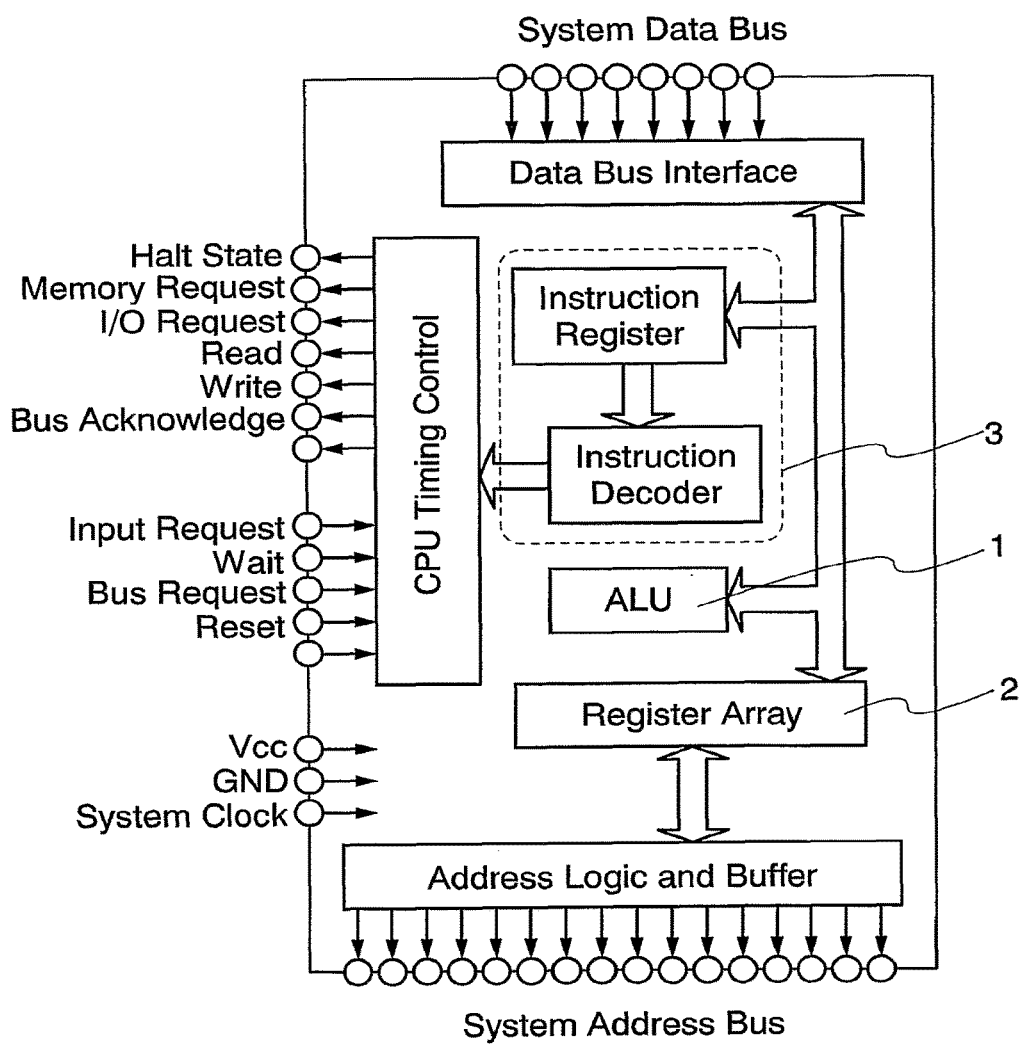
FIG. 13 is a diagram showing an arithmetic processing means which a processor of the invention has.

A configuration of the arithmetic processing means 100 according to the invention is not limited to the configuration mentioned in any one of FIGS. 7 to 9, and an element which is not required among the above elements may be appropriately deleted, and another element may be appropriately added. Further, a known arithmetic processing means, namely a configuration of a CPU can be used. For example, a Complex Instruction Set Computer (CISC) structure or a Reduced Instruction Set computer (RISC) structure can be used. FIG. 13 shows a block diagram of a CPU. The CPU is a CISC having a standard structure including an ALU (Arithmetic and Logic Unit) 1, a general register 2, an instruction analyzer 3, and the like. According to the invention, this CISC configuration of a CPU can be used. In addition, VLIW (Very Long Instruction Word) can be also employed. The width of the bus may be from 8 bit to 32 bit, or 32 bit or more.

Embodiment Mode 2

In this embodiment mode, a step for manufacturing a sophisticated integrated circuit by a SPOP method with a thin film transistor as a transistor in which at least a channel formation region is formed from an island-shaped semiconductor film which has a film thickness of from 10 nm to 200 nm is described.

Figure 2A:
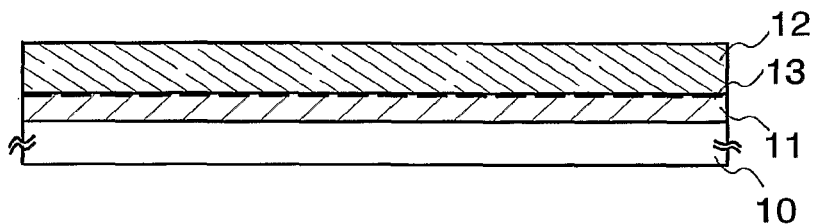
FIGS. 2A to 2E are views showing a step for manufacturing a processor of the invention.
Figure 2B:
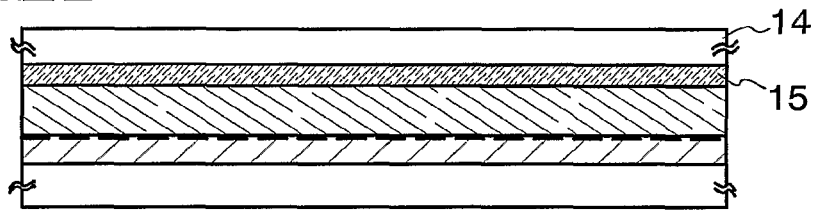

First, as shown in FIG. 2A, a metal film 11 is formed over a first substrate 10. The first substrate may have rigidity capable of withstanding a subsequent stripping step, and for example, a glass substrate, a quartz substrate, a ceramic substrate, a silicon substrate, a metal substrate, or a stainless steel substrate can be used as the first substrate. A single layer formed from an element selected from W, Ti, Ta, Mo, Nd, Ni, Co, Zr, Zn, Ru, Rh, Pd, Os, and Ir, or an alloy material or a compound material containing the element as its main component, or a lamination thereof can be used as the metal film. As a method for manufacturing the metal film, for example, a sputtering method using a metal target may be used. The metal film may be formed to have a film thickness of from 10 nm to 200 nm, preferably, from 50 nm to 75 nm.

A film formed from the above metal which is nitrided (for example, tungsten nitride or molybdenum nitride) may be used instead of the metal film. In addition, a film formed from an alloy of the above metal (for example, an alloy of W and Mo: $W_xMo_{1-x}$) may be used instead of the metal film. In this case, a sputtering method using a plurality of targets such as a first metal (W) and a second metal (Mo) or using a target of the alloy of a first metal (W) and a second metal (Mo) in a deposition chamber may be used. Further, nitrogen or oxygen may be added to the metal film. A metal film may be formed by ion-implanting nitrogen or oxygen therein, or a metal film may be formed by a sputtering method in a nitride atmosphere or an oxygen atmosphere in the deposition chamber or a metal film may be formed by using a nitride metal target.

A stripping step can be controlled and a process margin can be expanded by appropriately setting a method for forming the metal film. Specifically, a heat temperature for stripping or the necessity of the heat treatment can be controlled.

Subsequently, a layer to be stripped 12 having an element formation region is formed over the metal film 11. In this layer to be stripped, an oxide film having silicon is stacked so as to be in contact with the metal film. The layer to be stripped may have an antenna. The layer to be stripped 12 is preferably provided with an insulating film having nitrogen, such as a silicon nitride (SiN) film or a silicon nitride oxide (SiON or SiNO) film so that the insulating film is in contact with the metal film to prevent impurities or dust from the metal film or the substrate from penetrating. The insulating film serves as a base film of the thin film transistor.

As the oxide film having silicon, silicon oxide, silicon oxynitride, or the like may be formed by a sputtering method or a CVD method. A film thickness of the oxide film having silicon is desirably approximately twice or more that of the metal film. In this embodiment mode, the silicon oxide film is formed so as to have a film thickness of from 150 nm to 200 nm by a sputtering method using a silicon target.

When the oxide film having silicon is formed, oxide (metal oxide) 13 having the metal is formed over the metal film. Thin metal oxide formed over the surface of the metal film by treating with an aqueous solution having sulfuric acid, hydrochloric acid, or nitric acid, an aqueous solution in which hydrogen peroxide water is mixed with sulfuric acid, hydrochloric acid, or nitric acid, or ozone water can be used as the metal oxide. Further, plasma treatment in an oxygen atmosphere or oxidation treatment which generates ozone by ultraviolet irradiation in an atmosphere containing oxygen may be carried out as other methods, and furthermore, the metal oxide may be formed by heating at a temperature of from 200° C. to 350° C. with a clean oven.

The metal oxide may be formed to have a film thickness of from 0.1 nm to 1 μm, preferably from 0.1 nm to 100 nm, and more preferably from 0.1 nm to 5 nm.

The oxide film having silicon, the base film, or the like is collectively referred to as an insulating film. In other words, a metal film, metal oxide, an insulating film, and a semiconductor film are stacked. In addition, the metal film and the metal oxide film can be referred to as a stripping layer.

A semiconductor element, for example, a thin film transistor (TFT) in which at least a channel formation region is formed from an island-shaped semiconductor film which has a film thickness of from 10 nm to 200 nm is formed by performing a predetermined manufacturing step on a semiconductor film. This semiconductor element includes the arithmetic processing means 100, the storage means 102, the power supply circuit 103, and the interface (I/F) 104. An insulating film containing carbon such as DLC or carbon nitride (CN) or an insulating film containing nitrogen such as silicon nitride (SiN) or silicon nitride oxide (SiNO or SiON) is preferably provided as a protective film which protects the semiconductor element.

After forming the above layer to be stripped 12, specifically, after forming the metal oxide, heat treatment is appropriately carried out to crystallize the metal oxide. For example, in the case of using W (tungsten) for the metal film, the metal oxide of $WO_2$ or $WO_3$ becomes a crystal condition when heat treatment is carried out at a temperature of 400° C. or more. In such the heat treatment, a temperature or the necessity of the heat treatment may be determined according to the metal film to be selected. In other words, the metal oxide may be crystallized according to need to strip easily.

In the case where heating is performed after forming a semiconductor film of the layer to be stripped 12, hydrogen in the semiconductor film can be diffused. There is a case that valence of the metal oxide varies due to this hydrogen.

Further, the number of steps for manufacturing a semiconductor element may be reduced by using the heating step both as a manufacturing step of a semiconductor element and a heating step. For example, heat treatment can be performed with a heating oven or laser irradiation in the case of forming a crystalline semiconductor film.

Then, the layer to be stripped 12 is pasted to a support substrate 14 with a first adhesive agent 15. A substrate having higher rigidity than that of the first substrate 10 is preferably used for the support substrate 14. An adhesive agent which can be stripped, for example, an ultraviolet stripping type adhesive agent which is stripped by ultraviolet, a heat stripping type adhesive agent which is stripped by heat, a water-soluble adhesive agent which is stripped by water, a two-sided tape, or the like may be used for the first adhesive agent 15.

Figure 2C:
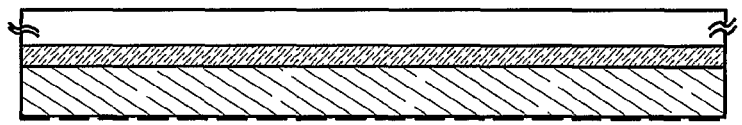

Then, the first substrate 10 provided with the metal film 11 is stripped by a physical means (FIG. 2C). Although the figure is not shown since it is a schematic view, the first substrate is separated within layers of the crystallized metal oxide, or at an interface between the metal oxide and the metal film or at an interface between the metal oxide and the layer to be stripped. Thus, the layer to be stripped 12 can be stripped from the first substrate 10.

At this time, it is preferably that a part of the substrate is cut to scratch the vicinity of an stripping interface, namely the interface of the metal film and the metal oxide film therebetween with a cutter or the like in order to perform stripping easily.

Figure 2D:
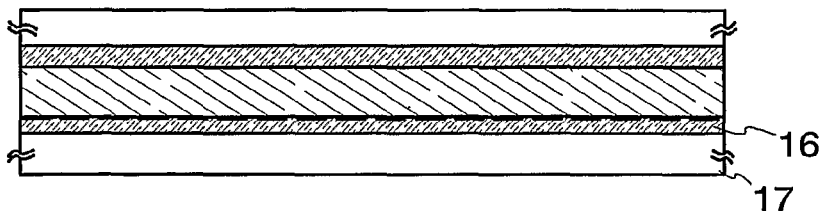

And then, as shown in FIG. 2D, the layer to be stripped 12 which is stripped is pasted and fixed to a second substrate (for example, a plastic substrate) 17 which is to be a transcriptional body with a second adhesive agent 16. An ultraviolet cured resin, specifically, an epoxy resin based adhesive agent or an adhesive agent such as a resin additive; a two-sided tape; or the like may be used for the second adhesive agent 16. In the case where the second substrate has an adhesive property, the second adhesive agent is not required.

A plastic material or the like such as polyethylene terephthalate, polycarbonate, polyarylate, or polyethersulfone can be used for the second substrate. Such the second substrate is referred to as a plastic substrate. Such the plastic substrate has flexibility and is lightweight. Irregularity of the surface may be reduced, and rigidity, resistance, and stability may be enhanced by performing coating treatment on the plastic substrate.

Figure 2E:

Then, the first adhesive agent 15 is removed to strip the support substrate 14 (FIG. 2E). Specifically, ultraviolet irradiation, heating, or washing may be carried out to strip the first adhesive agent.

Further, removing the first adhesive agent and curing the second adhesive agent may be carried out in one step. For example, in the case where a pair of a heat stripping type resin and a heat curing type resin, or a pair of an ultraviolet stripping type resin and an ultraviolet curing resin are used for a pair of the first adhesive agent and the second adhesive agent, respectively, the removing and curing can be carried out by one time heating or ultraviolet irradiation.

The sophisticated integrated circuit fixed to the plastic substrate can be formed as described above.

There is a case that the metal oxide 13 is wholly removed from the sophisticated integrated circuit or a case that a part or most of the metal oxide 13 is dotted (remains) in the lower surface of the layer to be stripped. In the case where the metal oxide 13 remains, the layer to be stripped may be fixed to the plastic substrate after removing by etching or the like. In this case, the oxide film having silicon may be removed.

The sophisticated integrated circuit of the invention is formed using an island-shaped semiconductor film which has a film thickness of from 10 nm to 200 nm, while a film thickness of an IC manufactured with a silicon wafer is approximately 50 μm; therefore, the sophisticated integrated circuit becomes extremely thin. As a result, a processor of the invention can be formed to be extremely thin, flexible, and lightweight. Consequently, a processor which is superior in impact resistance and flexibility can be obtained.

Further, backgrinding which causes a crack or the trace of polishing is not required unlike the IC manufactured with a silicon wafer, and the variation of the thickness is approximately several hundred nm at most since the variation depends on the variation of the semiconductor film or the like at the time of depositing, and thus, the variation can be drastically reduced compared with the variation of from several to several ten μm by backgrinding.

A substrate provided with an element formation region can be reused by a SPOP method as described above, and consequently, the price per one processor can be reduced. Further, the substrate provided with an element formation region is not required to transmit laser light; therefore, the degree of freedom of design can be increased.

Embodiment Mode 3

Even in a SPOP method using a metal film, a stripping layer which can be selectively removed is formed and the stripping layer is removed. And then, an element formation region may be fixed over a plastic substrate or a plastic film substrate. In this embodiment mode, the case where the stripping layer is selectively removed is described.

Figure 3A:
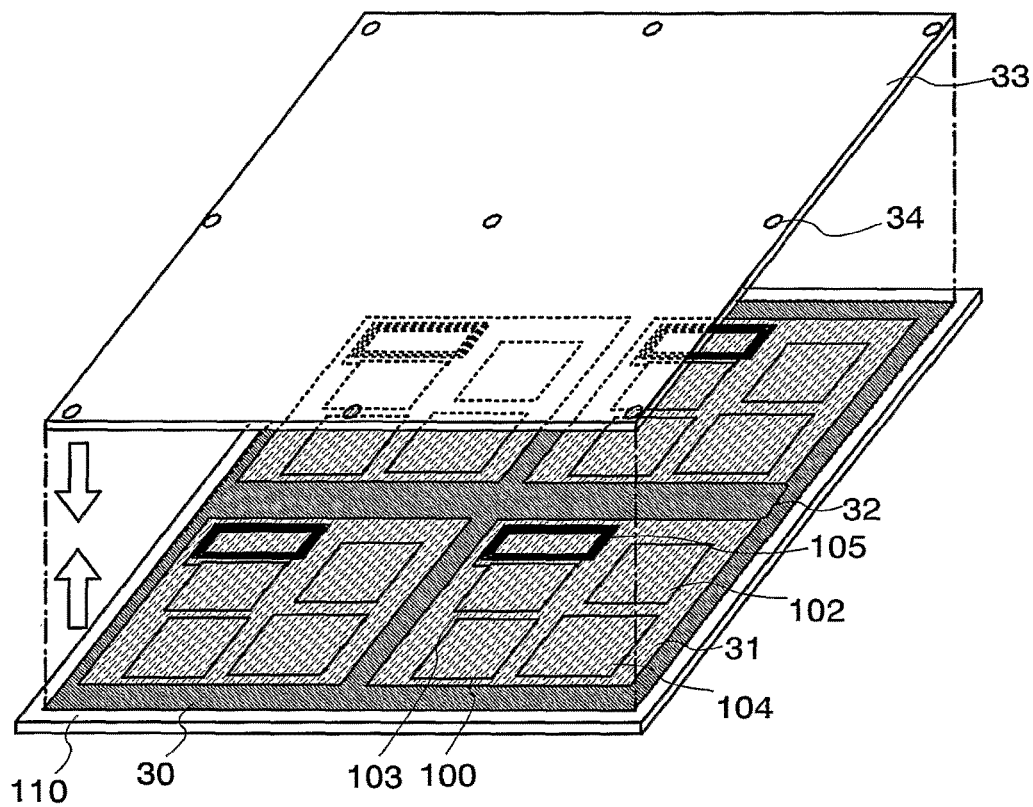
FIGS. 3A and 3B are views showing a step for manufacturing a processor of the invention.

As shown in FIG. 3A, a stripping layer 30 and a layer to be stripped having an element formation region 31 are sequentially formed over an insulating surface 110. The element formation region 31 has an arithmetic processing means 100, a storage means 102, a power supply circuit 103, an interface (I/F) 104, and an antenna 105. A manufacturing method or a structure of the layer to be stripped having the element formation region 31 is the same as that of Embodiment Mode 2; therefore, the description is omitted.

The stripping layer 30 may be a film having silicon, and the state may be any one of an amorphous semiconductor, a semi-amorphous semiconductor (also referred to as SAS) in which an amorphous state and a crystal state is mixed, and a crystalline semiconductor. SAS includes a microcrystal semiconductor in which a crystal grain of from 0.5 nm to 20 nm can be observed in an amorphous semiconductor. These stripping layers 30 can be formed by a sputtering method, a plasma CVD method, or the like. The stripping layer 30 may have a film thickness of from 30 nm to 1 μm, and the film thickness can be 30 nm or less if the thin film formation limit of a deposition device of the stripping layer allows.

An element such as phosphorous or boron may be added to the stripping layer 30. The element may be activated by heat or the like. The reaction speed of the stripping layer, namely an etching rate can be improved by adding the element.

As for the layer to be stripped, an insulating film is formed in a region being in contact with the stripping layer 30 so that the element formation region 31 is not etched. The insulating film can serve as a base film of a thin film transistor. A single layer structure of an insulating film having oxygen or nitrogen such as silicon oxide (SiOx), silicon nitride (SiNx), silicon oxynitride (SiOxNy) (x>y), or silicon nitride oxide (SiNxOy) (x>y) (x, y=1, 2 . . . ), or a lamination thereof can be used for the insulating film. For example, in the case of using lamination of three layers, a silicon oxide film can be used as a first insulating film; a silicon oxynitride film, as a second insulating film; and a silicon oxide film, as a third insulating film. The silicon oxynitride film is preferably used for these insulating films considering impurity diffusion from the insulating surface 110 or the like; however, there is concern that the silicon oxynitride film has low adhesion between the stripping layer and a semiconductor film of a TFT. Therefore, a lamination of three layers provided with a silicon oxide film having high adhesion between the stripping layer, the semiconductor film, and the silicon oxynitride film may be used.

Figure 3B:
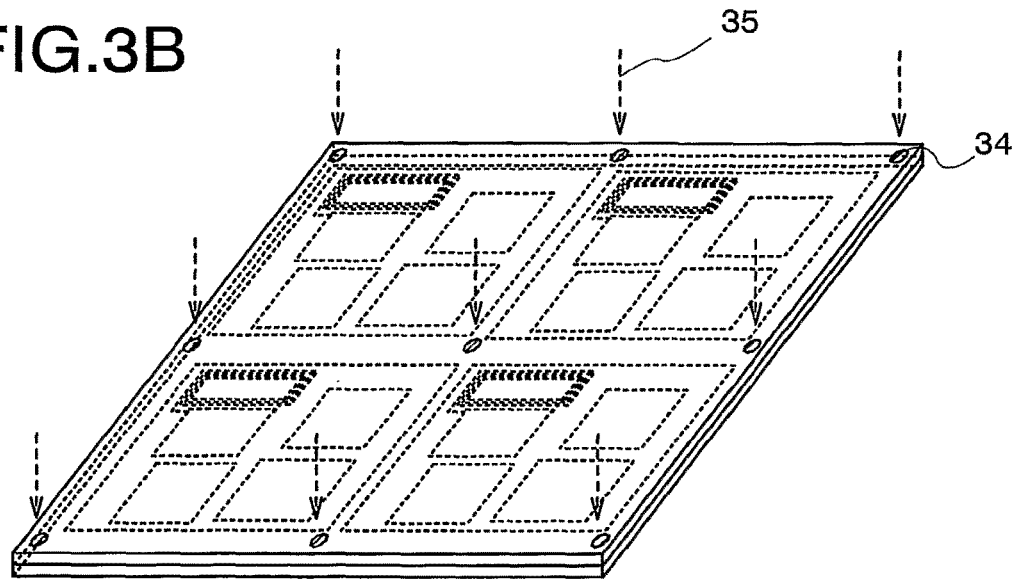

In the above state, a groove 32, a hole, or the like exposing the stripping layer 30 is formed other than the element formation region 31, and an etching agent 35 is introduced into the groove 32, the hole, or the like. For example, a support substrate 33 provided with the hole 34 or the like is fixed to the insulating surface 110, and then, the etching agent 35 is introduced into the hole 34 and the groove 32 as shown in FIG. 3B. Consequently, the stripping layer 30 can be removed.

Gas or liquid containing halogen fluoride can be used as an etching gas. For example, $ClF_3$ (chlorine trifluoride) can be used as halogen fluoride. The stripping layer 30 is selectively etched with such the etching gas. More specifically, the stripping layer can be removed using a low pressure CVD device in the following condition: a temperature is 350° C.; a flow of $ClF_3$ is 300 sccm; a pressure is 6 Torr; and time is 3 hours.

Thus, the stripping layer 30 is removed and the insulating layer 110 is stripped. And then, the element formation region 31 can be fixed over a plastic substrate or a plastic film substrate.

Even in the case of selectively removing the stripping layer as described above, the substrate provided with the element formation region 31 can be reused. Consequently, the price per one processor can be reduced. Further, the substrate provided with an element formation region is not required to transmit laser light; therefore, the degree of freedom of design can be increased.

Embodiment Mode 4

In this embodiment mode, a structure of a TFT is described.

Figure 4:
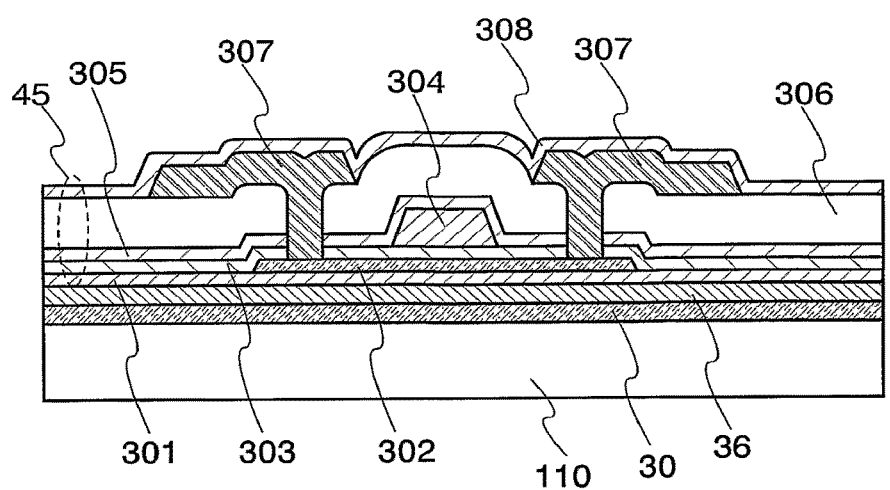
FIG. 4 is a view showing a structure of a thin film transistor which a processor of the invention has.

FIG. 4 shows one example to which a top-gate TFT is applied. A stripping layer 30 and first insulating films 36 and 301 which are stacked are formed over a first substrate 110 corresponding to an insulating surface, and an element formation region, namely an element formation layer 45 is provided thereover. At least the first insulating film 301 serves as a base film for a semiconductor film 302. A second insulating film 303 covering the semiconductor film 302 and serving as a gate insulating film is provided. A conductive film which serves as a gate electrode 304 is formed over the second insulating film 303, and a third insulating film 305 which serves as a protective layer and a fourth insulating film 306 which serves as an interlayer insulating film are provided thereover. Further, a fifth insulating layer 308 which serves as a protective layer may be formed on the upper side of the insulating film 306.

The semiconductor film 302 is formed from a semiconductor having a crystalline structure (crystalline semiconductor), and a non-single crystal semiconductor or a single crystal semiconductor can be used. Especially, a crystalline semiconductor in which an amorphous semiconductor or a microcrystal semiconductor is crystallized by laser light irradiation, a crystalline semiconductor crystallized by heat treatment, or a crystalline semiconductor crystallized by combining heat treatment and laser light irradiation is preferably applied. A crystallization method using a metal element such as nickel having an enhancing property for crystallizing a silicon semiconductor can be applied to heat treatment.

In the case of crystallizing by laser light irradiation, the semiconductor film can be crystallized by continuous oscillation laser light irradiation. In addition, the semiconductor film can be crystallized while continuously moving a molten zone, in which the semiconductor film is molten, in a direction of the laser light irradiation by irradiation with a high repetition rate intense pulsed light having a repetition rate of 10 MHz or more and a pulse width of 1 nanosecond or less, preferably from 1 to 100 picoseconds. A crystalline semiconductor film having a large grain diameter and a crystal grain boundary which extends in one direction can be obtained by such a crystallization method which irradiates the semiconductor film with a laser light. Electron field effect mobility of a transistor can be enhanced by setting a moving direction of a carrier to the direction in which the crystal grain boundary extends. Electron field effect mobility of 400 $cm^2$/V·sec or more can be enhanced.

As described above, in the case of forming the stripping layer 30 from tungsten (W), heat treatment at a temperature of 400° C. or more is required to strip without failing at an interface between the stripping layer and the layer to be stripped 12. The heating step can be used together with heat crystallization step of the semiconductor film.

The gate electrode 304 can be formed from a polycrystalline semiconductor to which metal or one conductive type impurity is added. In the case of using metal, tungsten (W), molybdenum (Mo), titanium (Ti), tantalum (Ta), aluminum (Al), or the like can be used. In addition, metal nitride in which the above metal is nitrided can be used. A structure of stacking a first layer formed form the metal nitride and a second layer formed from the metal may be used. In the case of using a lamination structure, a so-called hat shape in which the edge portion of the first layer protrudes beyond the edge portion of the second layer may be used. At this time, barrier metal can be formed by forming the first layer from metal nitride. In other words, the metal in the second layer can be prevented from diffusing into the second insulating film 303 or the semiconductor film 302 which is the lower layer of the second insulating film 303.

Various structures such as a single drain structure, an LDD (Low concentration drain) structure, or a Gate Overlapped LDD structure can be applied to a transistor formed by combining the semiconductor film 302, the second insulating film 303, the gate electrode 304, and the like. In addition, a single-gate structure, a multigate structure in which transistors, to which gate voltage of the same electric potential equivalently is applied, are connected in series, or a dual-gate structure in which a semiconductor film is interposed with gate electrodes from above and below can be applied.

The fourth insulating layer 306 can be formed from an inorganic insulating material such as silicon oxide or silicon oxynitride or an organic insulating material such as an acrylic resin or a polyimide resin. In the case of using a coating method such as spin coating or roll coating, silicon oxide formed by coating an insulating film material dissolved in an organic solvent and then by performing heat treatment can be used. For example, an insulating layer which can be formed by forming a coating film including a siloxane bond and then by performing heat treatment at a temperature of from 200° C. to 400° C. can be used. When an insulating film formed by a coating method is used as the fourth insulating film 306, the surface can be planarized. An insulating film can be planarized by a reflow step. When a wiring is formed over a thusly planarized insulating film, disconnection thereof can be prevented. Further, a method for forming a wiring over the planarized insulating film can be effectively used in the case of forming a multilayer wiring.

A wiring 307 is formed over the fourth insulating film 306. The wiring is preferably formed by a combination of a low resistant material such as aluminum (Al) and barrier metal using a high melting point metal material such as titanium (Ti) or molybdenum (Mo), such as a lamination structure of titanium (Ti) and aluminum (Al) or a lamination structure of molybdenum (Mo) and aluminum (Al). The wiring 307 can be provided so as to be intersected with a wiring formed from the same layer as that of the gate electrode 304, specifically, a scanning line. Further, a multilayer wiring structure can be formed by stacking a plurality of insulating films having the similar function to the fourth insulating film 306 and then forming a wiring over the insulating films.

Figure 5:
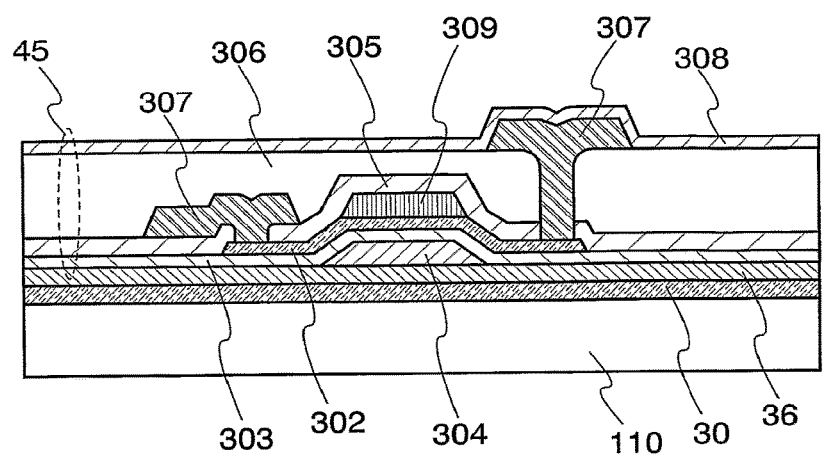
FIG. 5 is a view showing a structure of a thin film transistor which a processor of the invention has.

FIG. 5 shows one example of applying a bottom-gate TFT. The stripping layer 30 and the insulating film 36 are sequentially formed over the first substrate 110, and the element formation layer 45 is provided thereover. The element formation layer 45 is provided with the gate electrode 304, the second insulating film 303 which serves as a gate insulating film, the semiconductor film 302, a channel protective layer 309, the third insulating film 305 which serves as a protective layer, and the fourth insulating film 306 which serves as an interlayer insulating layer. The fifth insulating film 308 which serves as a protective layer may be formed thereover. The wiring 307 can be formed over the third insulating film 305 or the fourth insulating film 306.

Thus, a thin film transistor used for a sophisticated integrated circuit may be a top-gate type or a bottom-gate type. The thin film transistor may be used by combining top-gate type and bottom-gate type. In other words, the invention is not limited to the structure of a thin film transistor.

Such a stripping method of a sophisticated integrated circuit can employ Embodiment Mode 2 or 3.

Embodiment Mode 5

In this embodiment mode, an exchange of a signal or power between a reader/writer device 400 and a processor 108 is described.

Figure 6A:
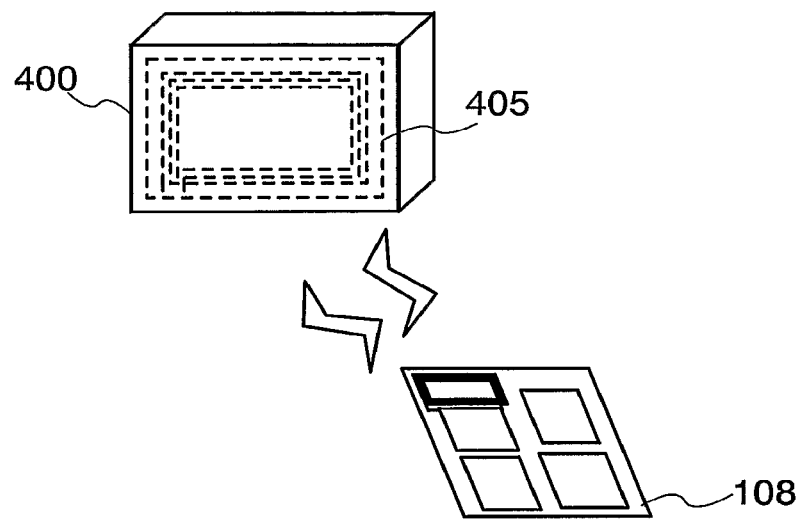
FIGS. 6A and 6B are views showing a usage mode of a processor of the present invention.

As shown in FIG. 6A, when the processor 108 is held up over the reader/writer device 400 having an antenna 405, power is supplied from the reader/writer device 400. The power is supplied to a power supply circuit 103 through the antenna 105 in which the processor 108 has. Consequently, the processor 108 can perform arithmetic processing of the arithmetic processing means 100 or write into the storage means 102.

Figure 6B:
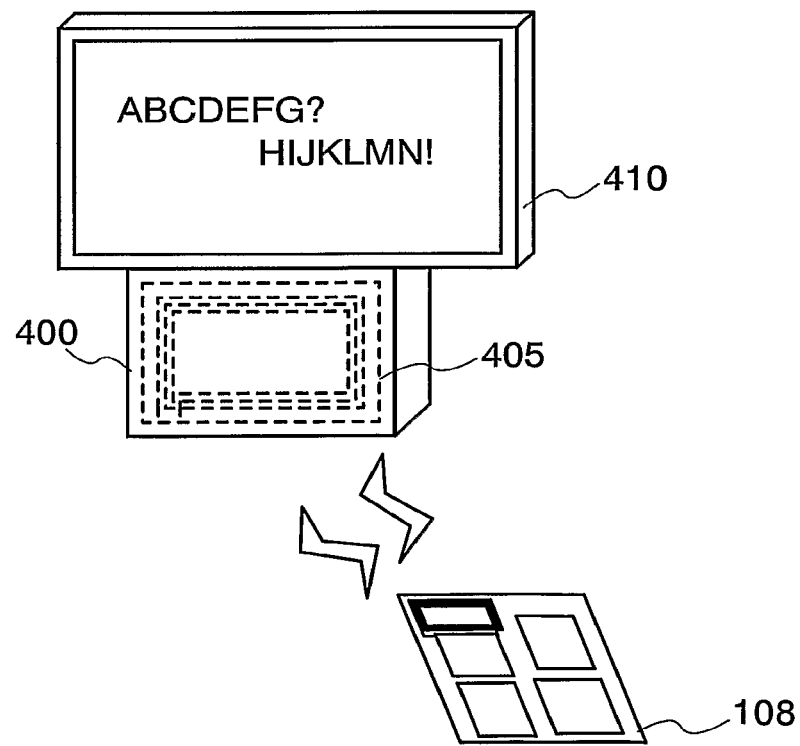

As shown in FIG. 6B, a display means 410 may be provided for the reader/writer device 400. A light emitting device having a self-light emitting element, a liquid crystal display device, or other display device can be used as a display means. Information on the processor 108 can be displayed with the display means 410.

Such the reader/writer 400 and the processor 108 can receive power or a signal without wires. The processor 108 can transmit/receive information between the display means and the processor without wires.

Power can be supplied from a plurality of the reader/writer devices 400. Consequently, power can be appropriately obtained without running out of power even in the case of moving with carrying the processor 108.

When a plurality of reader/writer device 400 is provided, the processor 108 can perform arithmetic processing by sharing. For example, in the case of performing from a first arithmetic processing to a third arithmetic processing, the processing may be made to carried out from a first reader/writer device to a third reader/writer device, respectively. Thereafter, arithmetic processing is combined with the processor 108, and thus, a certain result can be obtained.

According to the processor of the present invention, poor connection or the like of a connector can be eliminated. Further, a problem with handling or the like due to a wiring connecting each of the devices can be eliminated. Thus, an added value of a processor can be enhanced by transmitting/receiving power or a signal without wires.

This embodiment mode can be freely combined with the above embodiment modes.

Embodiment Mode 6

In this embodiment mode, a case where a processor according to the present invention is applied to a car 150 as a vehicle is described.

Figure 10A:
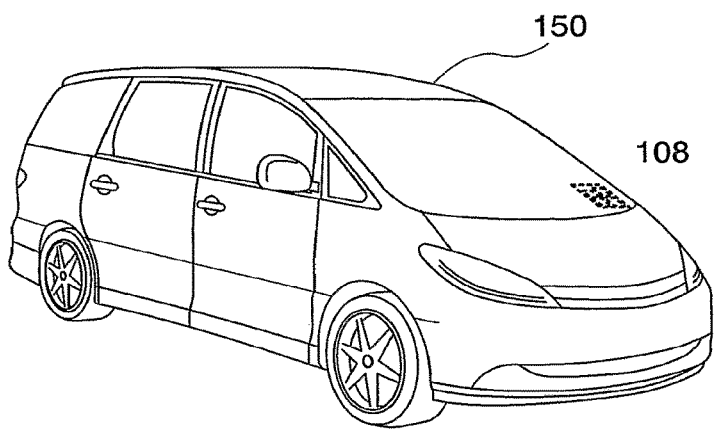
FIGS. 10A and 10B are views showing a car mounted with a processor of the invention.

FIG. 10A shows a case where a processor 108 is mounted on the car 150. The processor 108 of the invention has translucency, which is different from a processor manufactured using a silicon wafer; therefore, the processor 108 may be mounted on a windshield of the car. Such the processor 108 can exchange power or a signal with a reader/writer device 400 provided for an external portion of the car 150.

For example, the key of the car 150 can be unlocked or/and locked using the processor 108. The fare payment in case of passing a toll road can be carried out using the processor 108. Further, security can be enhanced according to the processor 108 having a sophisticated integrated circuit of the invention. The processor 108 having a sophisticated integrated circuit of the invention can serve a number of functions.

Figure 10B:
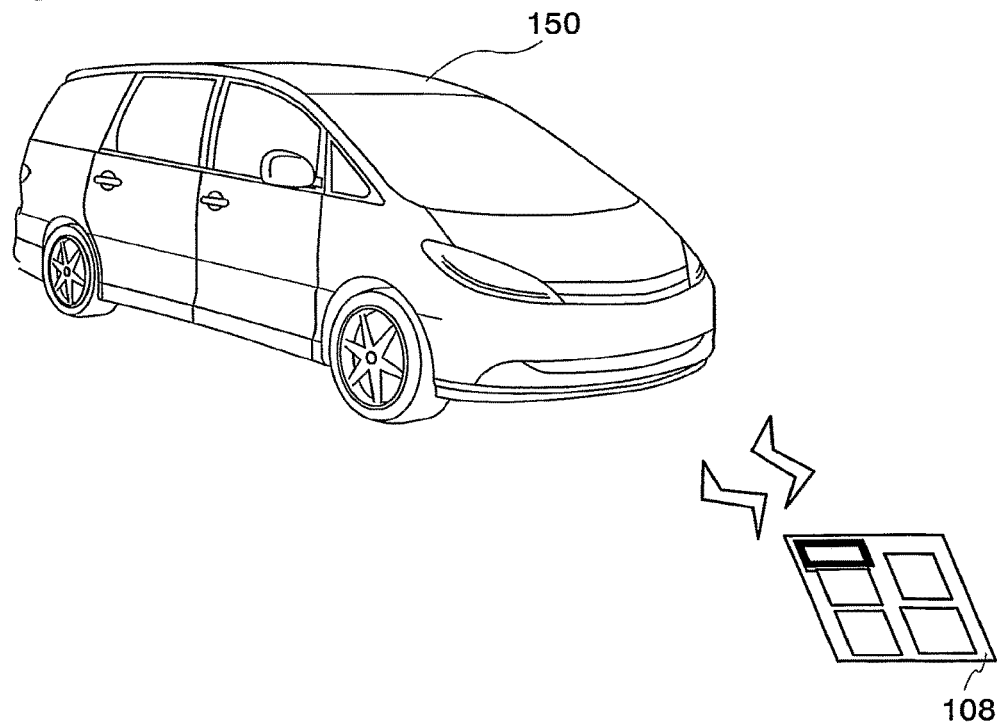

As shown in FIG. 10B, a signal can be transmitted from the processor 108 with the reader/writer device 400 mounted on the car 150. Consequently, the key of the car 150 can be unlocked or/and locked.

In the case of carrying the processor 108 of the invention, in which power or a signal is transmitted/received without wires, a problem with handling or the like due to a wiring connecting each of the devices can be eliminated.

The description is made using a car in this embodiment mode; however, the processor of the invention may be applied to a bicycle, a motorcycle, or the like.

This embodiment mode can be freely combined with the above embodiment modes.

Embodiment Mode 7

A CPU formed over a plastic substrate can be mounted on various electronic devices, and according to this, an electronic device can be realized, in which lightweight, or small-sizing and thinning is attained. In this embodiment mode, a case where a processor according to the present invention is mounted on an electronic device is described.

Figure 11A:
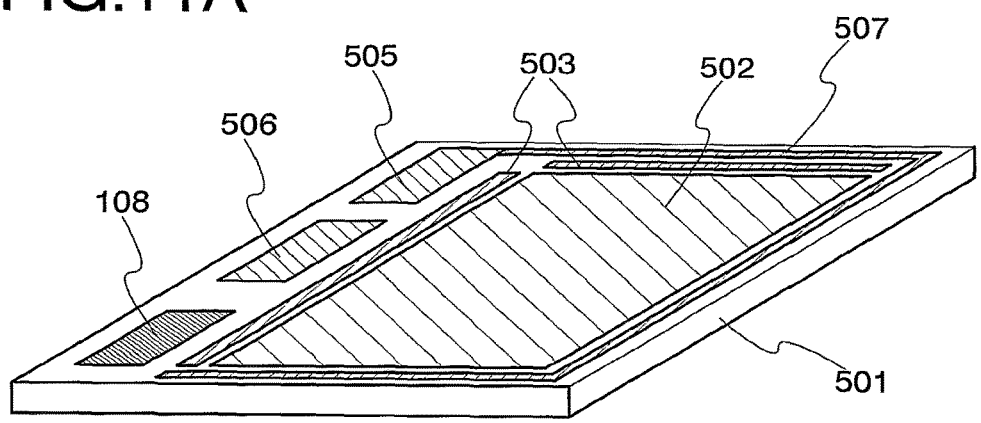
FIGS. 11A and 11B are views showing a usage mode of a processor of the present invention.

FIG. 11A shows a mode of mounting a processor of the invention on a display panel in which a material of liquid crystal or electroluminescence is utilized. The display panel has a pixel portion 502 which is formed using a TFT over a plastic substrate 501 and displays information such as an image or a characteristic, and a driver circuit portion 503 for displaying by controlling a signal which is to be inputted to the pixel portion 502. The pixel portion 502 is provided with an information input means such as an input function using a touch pen, and a thin computer can be realized by mounting the processor 108 of the invention on the plastic substrate 501 or manufacturing by the same step.

Figure 11B:
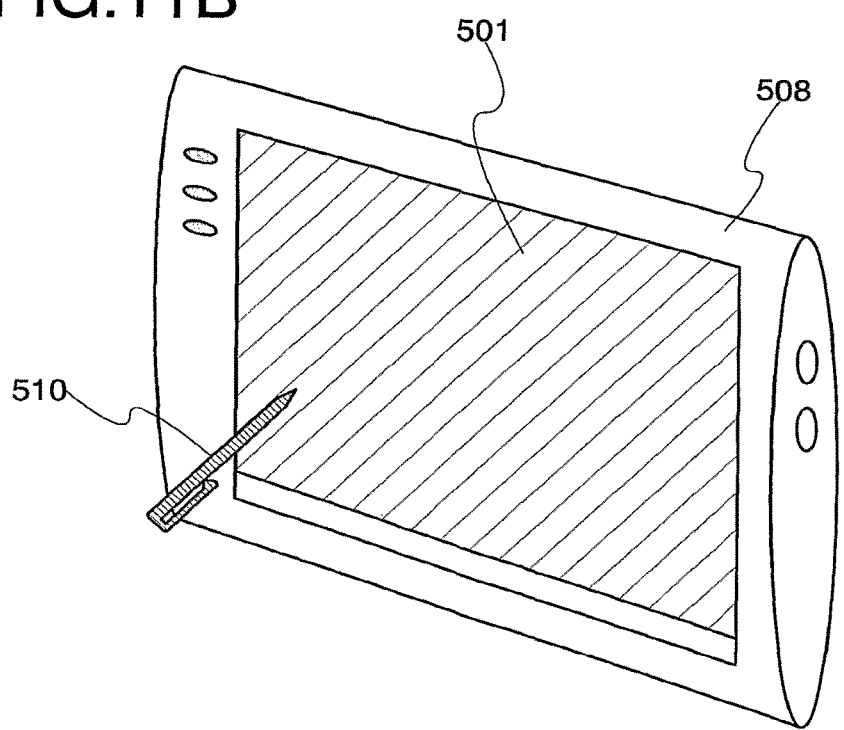

Further, a memory 506, a communication circuit 505, or an antenna 507 in an external portion of the processor 108 may be provided. Consequently, connecting lines or connecting to the internet by a new means without wires, in addition to a means without wires provided for the processor can be carried out. FIG. 11B shows a thin computer 508 provided with such a function. A glass substrate or a printed board formed from an epoxy resin or the like is not required to be used by using the plastic substrate 501 as a substrate on which the pixel portion 502 and the processor 108 of FIG. 11A are mounted; therefore, integration of a pixel portion or various circuits over one substrate, namely systemization, can be realized. Information can be inputted using a pen 510 by providing an information input means such as an input function using a touch pen for the pixel portion 502.

Figure 12A:
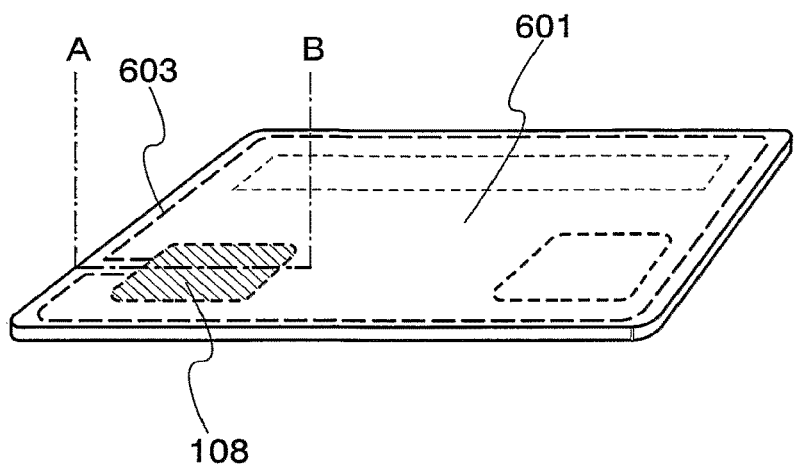
FIGS. 12A and 12B are an electronic device mounted with a processor of the invention.
Figure 12B:
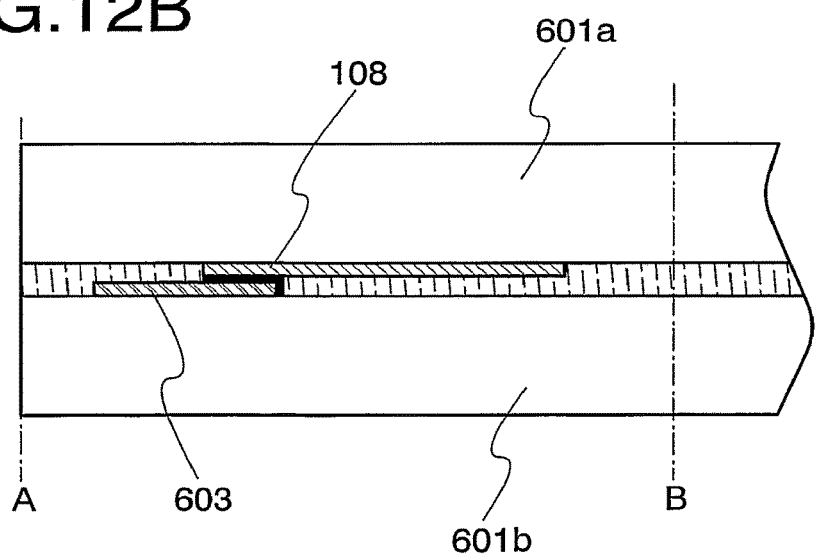

FIG. 12A shows an IC card 601 on which the processor 108 of the invention is mounted, and an antenna 603 may be formed in an external portion of the processor. Consequently, communication can be performed with a reader/writer device by a new means without wires, in addition to a means without wires provided for the processor. According to the processor 108 formed over the plastic substrate of the invention, an IC card having a thickness nearly equal to a conventional magnetic prepaid card can be realized. In other words, as shown in FIG. 12B, when the processor 108 is formed to have a thickness of from 3 μm 10 μm and films 601*a* and 601*b* formed from polyethylene terephthalate having a thickness of 0.1 μm are each pasted to the upper side and the lower side of the processor 108, an IC card having a thickness of from 0.2 mm to 0.3 mm which is almost equal to a thickness of the film, can be realized.

According to the processor of the invention, information and communication equipment such as a computer or a telephone set mounted with the processor can be completed as described above, and further, the processor can be applied to a commodity distribution system such as an IC tag.

Thus, an added value of a processor, namely an electronic appliance as described above, can be enhanced by transmitting/receiving power or a signal without wires. A buttery or the like is not required to be mounted since power can be received without wires, and thus, a further lightweight electronic device can be achieved.

This embodiment mode can be freely combined with the above embodiment modes.

EMBODIMENT

Embodiment 1

In this example, an electric characteristic of a thin film transistor in the case of stripping by using a SPOP method as shown in Embodiment Mode 2 is shown.

Table 1 shows an electric characteristic of an n-channel thin film transistor (channel length L/channel width W=8 μm/20 μm) before and after stripping.

TABLE 1

| | before transcription Vd = 3.3 V | after transcription Vd = 3.25 V |
|---|---|---|
| Ion[A/m] (Vg = 3.3 V) | 4.69 | 3.75 |
| Icut[μA/m] | 0.18 | 0.19 |
| μ(MAX) [cm$^2$/Vs] | 413 | 389 |
| S value[V/decade] | 0.114 | 0.156 |
| Vth[V] | 1.90 | 1.95 |

As shown in Table 1, an electric characteristic of an n-channel thin film transistor is not so much influenced before and after stripping.

Table 2 shows an electric characteristic of a p-channel thin film transistor (channel length L/channel width W=8 μm/20 μm) before and after stripping.

TABLE 2

| | before transcription Vd = 3.3 V | after transcription Vd = 3.25 V |
|---|---|---|
| Ion[A/m] (Vg = 3.3 V) | 9.93 | 9.70 |
| Icut[μA/m] | 6.65 | 5.41 |
| μ(MAX) [cm$^2$/Vs] | 241 | 250 |
| S value [V/decade] | 0.109 | 0.107 |
| Vth[V] | −0.48 | −0.48 |

As shown in Table 2, an electric characteristic of a p-channel thin film transistor is not so much influenced before and after stripping.

This application is based on Japanese Patent Application serial No. 2004-176289 filed in Japan Patent Office on Jun. 14, 2004, the entire contents of which are hereby incorporated by reference.

The invention claimed is:

1. A semiconductor device comprising:
a plastic substrate;
an adhesive agent over the plastic substrate;
an insulating film over the adhesive agent; and
a processor over the insulating film, the processor comprising:
an integrated circuit over the insulating film, the integrated circuit comprising a voltage generation circuit; and
an antenna over the insulating film, the antenna being connected to the voltage generation circuit,
wherein the voltage generation circuit and an entirety of the antenna overlap the insulating film,
wherein the integrated circuit comprises a transistor, and
wherein a power is provided to the voltage generation circuit through the antenna.

2. The semiconductor device according to claim 1, further comprising a pixel portion over the plastic substrate.

3. The semiconductor device according to claim 1, wherein the integrated circuit comprises an arithmetic processing means having an arithmetic and logic unit and register.

4. The semiconductor device according to claim 1, wherein the plastic substrate is one selected from a group consisting of polycarbonate, polyarylate, and polyethersulfone.

5. The semiconductor device according to claim 1, wherein the semiconductor device is incorporated into an electronic apparatus selected from a group consisting of a display panel, a computer, a telephone set, an IC tag and an IC card.

6. The semiconductor device according to claim 1, wherein the integrated circuit comprises an arithmetic processing means, a storage means and an interface.

7. The semiconductor device according to claim 1, wherein the transistor is a thin film transistor, and wherein a semiconductor film of the thin film transistor has a thickness of from 10 nm to 200 nm.

8. A semiconductor device comprising:
a plastic substrate;
an adhesive agent over the plastic substrate;
an insulating film over the adhesive agent; and
a processor over the insulating film, the processor comprising:
an integrated circuit over the insulating film, the integrated circuit comprising a voltage generation circuit;
an antenna over the insulating film, the antenna being connected to the voltage generation circuit; and
a light receiving element,
wherein the voltage generation circuit and an entirety of the antenna overlap the insulating film,
wherein the integrated circuit comprises a transistor, and
wherein a power is provided to the voltage generation circuit through the antenna.

9. The semiconductor device according to claim 8, further comprising a pixel portion over the plastic substrate.

10. The semiconductor device according to claim 8, wherein the integrated circuit comprises an arithmetic processing means having an arithmetic and logic unit and register.

11. The semiconductor device according to claim 8, wherein the plastic substrate is one selected from a group consisting of polycarbonate, polyarylate, and polyethersulfone.

12. The semiconductor device according to claim 8, wherein the semiconductor device is incorporated into an electronic apparatus selected from a group consisting of a display panel, a computer, a telephone set, an IC tag and an IC card.

13. The semiconductor device according to claim 8, wherein the integrated circuit comprises an arithmetic processing means, a storage means and an interface.

14. The semiconductor device according to claim 8, wherein the transistor is a thin film transistor, and wherein a semiconductor film of the thin film transistor has a thickness of from 10 nm to 200 nm.

15. A semiconductor device comprising:
a plastic substrate;
an adhesive agent over the plastic substrate;
a crystallized metal oxide comprising tungsten over the adhesive agent; and
a processor over the crystallized metal oxide, the processor comprising:
an integrated circuit comprising a voltage generation circuit; and
an antenna connected to the voltage generation circuit,
wherein the integrated circuit comprises a transistor, and
wherein a power is provided to the voltage generation circuit through the antenna.

16. The semiconductor device according to claim 15, further comprising a pixel portion over the plastic substrate.

17. The semiconductor device according to claim 15, wherein the integrated circuit comprises an arithmetic processing means having an arithmetic and logic unit and register.

18. The semiconductor device according to claim 15, wherein the plastic substrate is one selected from a group consisting of polycarbonate, polyarylate, and polyethersulfone.

19. The semiconductor device according to claim 15, wherein the semiconductor device is incorporated into an electronic apparatus selected from a group consisting of a display panel, a computer, a telephone set, an IC tag and an IC card.

20. The semiconductor device according to claim 15, wherein the integrated circuit comprises an arithmetic processing means, a storage means and an interface.

21. The semiconductor device according to claim 15,
wherein the transistor is a thin film transistor, and
wherein a semiconductor film of the thin film transistor has a thickness of from 10 nm to 200 nm.

* * * * *